(12) United States Patent
Park

(10) Patent No.: US 10,839,895 B2
(45) Date of Patent: Nov. 17, 2020

(54) MEMORY SYSTEM

(71) Applicant: SK hynix Inc., Gyeonggi-do (KR)

(72) Inventor: Min-Su Park, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/681,035

(22) Filed: Nov. 12, 2019

(65) Prior Publication Data

US 2020/0335157 A1 Oct. 22, 2020

(30) Foreign Application Priority Data

Apr. 22, 2019 (KR) ........................ 10-2019-0046912

(51) Int. Cl.
G11C 11/44 (2006.01)
G11C 11/406 (2006.01)
G06K 9/62 (2006.01)
G11C 15/06 (2006.01)
G11C 7/22 (2006.01)

(52) U.S. Cl.
CPC ............ G11C 11/44 (2013.01); G06K 9/6256 (2013.01); G11C 7/222 (2013.01); G11C 11/40615 (2013.01); G11C 11/40626 (2013.01); G11C 15/06 (2013.01)

(58) Field of Classification Search
CPC .......... G11C 7/04; G11C 7/1063; G11C 7/222
See application file for complete search history.

(56) References Cited

U.S. PATENT DOCUMENTS

| 2018/0197596 A1 | 7/2018 | Ware et al. | |
| 2019/0073007 A1* | 3/2019 | Izumi | G06F 3/0614 |
| 2020/0057581 A1* | 2/2020 | Choi | G11C 7/04 |

* cited by examiner

Primary Examiner — Han Yang
(74) Attorney, Agent, or Firm — IP & T Group LLP

(57) ABSTRACT

A memory system includes a control device suitable for generating first command signals for a unit time and storing first count information corresponding to the number of times to generate the first command signals based on temperature information, in a training mode, and generating second command signals based on the first count information and second count information in a normal mode, the second count information corresponding to the number of times to generate the second command signals for the unit time, and a memory device suitable for performing an internal operation based on the first command signals and providing the control device with the temperature information when performing the internal operation, in the training mode, and performing an internal operation based on the second command signals in the normal mode.

16 Claims, 3 Drawing Sheets

MEMORY SYSTEM

CROSS-REFERENCE TO RELATED APPLICATION

This application claims priority under 35 U.S.C. § 119 to Korean Patent Application No. 10-2019-0046912, filed on Apr. 22, 2019, the disclosure of which is incorporated herein by reference in its entirety.

BACKGROUND

1. Field

Various embodiments relate to a semiconductor design technique, and more particularly, to a memory system including a memory that operates at cryogenic temperatures.

2. Description of the Related Art

A memory device operating at a cryogenic temperature consumes much less power than a memory device operating at room temperature. For example, a memory cell in a dynamic random access memory (DRAM) operating at a cryogenic temperature has a longer data retention time than that of a DRAM operating at room temperature. Therefore, the DRAM operating at cryogenic temperature seldom performs a refresh operation or maximizes a refresh period, thereby reducing power consumption.

However, when a state of the cryogenic temperature is not maintained, that is, as the temperature rises, a memory operating at a cryogenic temperature may malfunction.

SUMMARY

Various embodiments are directed to a memory system capable of predicting and controlling a heat generation of a memory device in a normal mode.

In accordance with an embodiment, a memory system includes: a control device suitable for generating first command signals for a unit time and storing first count information corresponding to the number of times to generate the first command signals based on temperature information, in a training mode, and generating second command signals based on the first count information and second count information in a normal mode, the second count information corresponding to the number of times to generate the second command signals for the unit time; and a memory device suitable for performing an internal operation based on the first command signals and providing the control device with the temperature information when performing the internal operation, in the training mode, and performing an internal operation based on the second command signals in the normal mode.

The control device may stop the generation of the second command signals when the first count information and the second count information coincide with each other.

The memory device may enter a relax mode when the generation of the second command signals is stopped.

The relax mode may include a self-refresh mode.

The control device may update the first count information at each predetermined time interval.

The control device may include: a comparator suitable for comparing the temperature information with threshold temperature information, and generating a comparison result signal; a command counter suitable for counting the first command signals for the unit time and generating the first count information, based on a first enabled signal, and counting the second command signals for the unit time and generating the second count information, based on a second enable signal; a pattern generator suitable for generating pattern information based on the first enable signal; a scheduler suitable for generating schedule information based on the second enable signal, and stopping the generation of the schedule information based on a stop signal; a command generator suitable for generating the first command signals based on the pattern information, and generating the second command signals based on the schedule information; and a controller suitable for generating the first enable signal in the training mode, and generating the second enable signal and the stop signal in the normal mode, based on a clock signal, a training mode signal, a normal mode signal, the comparison result signal and the first and second count information.

The controller may generate a control signal based on the comparison result signal, and the pattern generator may change the pattern information based on the control signal.

The controller may further include a register for storing the first count information based on the comparison result signal.

The memory device may be disposed in a pseudo cryogenic region.

The pseudo cryogenic region may include a region with a temperature of 77K±7K.

In accordance with an embodiment, an operating method of a memory system: sensing a temperature of a memory device when the memory device performs an internal operation based on first command signals for a unit time, in a training mode; storing the number of times to generate the first command signals according to the temperature, in the training mode; and monitoring heat generation of the memory device based on the number of times to generate the first command signals according to the temperature when the memory device performs an internal operation based on second command signals for the unit time, in a normal mode.

The monitoring of the heat generation of the memory device may include monitoring the heat generation of the memory device by comparing the number of times to generate the second command signals with the number of times to generate the first command signals.

The operating method may further include stopping the generation of the second command signals when the memory device generates heat in the monitoring of the heat generation of the memory device, in the normal mode.

The memory device may enter a relax mode when the generation of the second command signals is stopped.

The relax mode may include a self-refresh mode.

In accordance with an embodiment, a memory system includes: a memory device including a temperature sensor; and a control device suitable for: providing training commands with the memory device in a training mode; monitoring a temperature of the memory device from the temperature sensor; when the monitored temperature is equal to a threshold temperature, determining the number of provided training commands; providing normal commands with the memory device in a normal mode; and when the number of the normal commands is equal to the number of provided training commands, stopping the providing of the normal commands.

DETAILED DESCRIPTION

Various embodiments are described below in more detail with reference to the accompanying drawings. These embodiments are provided so that this disclosure is thorough and complete, and fully conveys the scope of the present disclosure to those skilled in the art.

Figure 1:
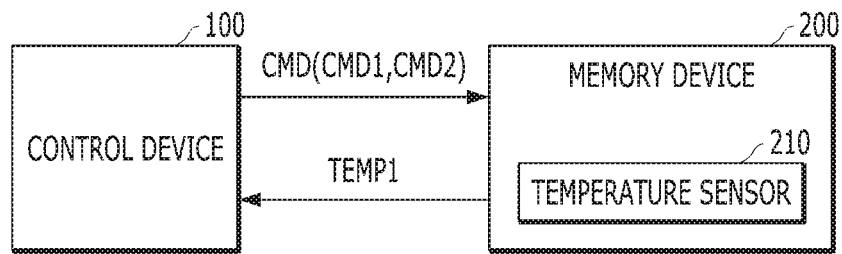
FIG. 1 is a block diagram illustrating a memory system in accordance with an embodiment.

FIG. 1 is a block diagram illustrating a memory system in accordance with an embodiment.

Referring to FIG. 1, the memory system may include a control device 100 and a memory device 200.

The control device 100 may be disposed in a region in a pseudo cryogenic temperature range (i.e., a pseudo cryogenic region) or a region in a room temperature range (i.e., a room temperature region). The pseudo cryogenic temperature range may include 77K±7K, and be a temperature range in which a memory device implemented with a complementary metal-oxide-semiconductor (CMOS) device can operate.

In a training mode, the control device 100 may generate command signals CMD for a unit time, and store count information CNT corresponding to the number of times to generate the command signals CMD based on temperature information TEMP1. The command signals CMD may be patterned so that the memory device 200 operates efficiently. Hereinafter, the command signals CMD generated in the training mode are referred to as "first command signals CMD1", and the count information CNT generated in the training mode is referred to as "first count information CNT1". The control device 100 may update the first count information CNT1 at each predetermined time interval.

In a normal mode, the control device 100 may generate command signals CMD, and generate count information CNT corresponding to the number of times to generate the command signals CMD for the unit time. Hereinafter, the command signals CMD generated in the normal mode are referred to as "second command signals CMD2", and the count information CNT generated in the normal mode is referred to as "second count information CNT2". The control device 100 may stop the generation of the second command signals CMD2 based on the first and second count information CNT1 and CNT2 in the normal mode. For example, the control device 100 may stop the generation of the second command signals CMD2 when the first count information CNT1 and the second count information CNT2 coincide with each other.

The memory device 200 may be disposed in the pseudo cryogenic region. For example, the memory device 200 may include a dynamic random access memory (DRAM). The DRAM may typically include the CMOS device, and operates stably at the pseudo cryogenic temperature. In addition, since the DRAM rarely requires a refresh operation in the pseudo cryogenic state, the DRAM is more advantageous in terms of power when operating in the pseudo cryogenic state than when operating at room temperature.

In the training mode, the memory device 200 may perform an internal operation based on the first command signals CMD1, and provide the control device 100 with temperature information TEMP1 when performing the internal operation. The memory device 200 may include a temperature sensor 210 for generating the temperature information TEMP1.

In the normal mode, the memory device 200 may perform an internal operation based on the second command signals CMD2. The memory device 200 may enter a relax mode when the generation of the second command signals CMD2 is stopped in the normal mode. For example, the relax mode may include a self-refresh mode.

Figure 2:
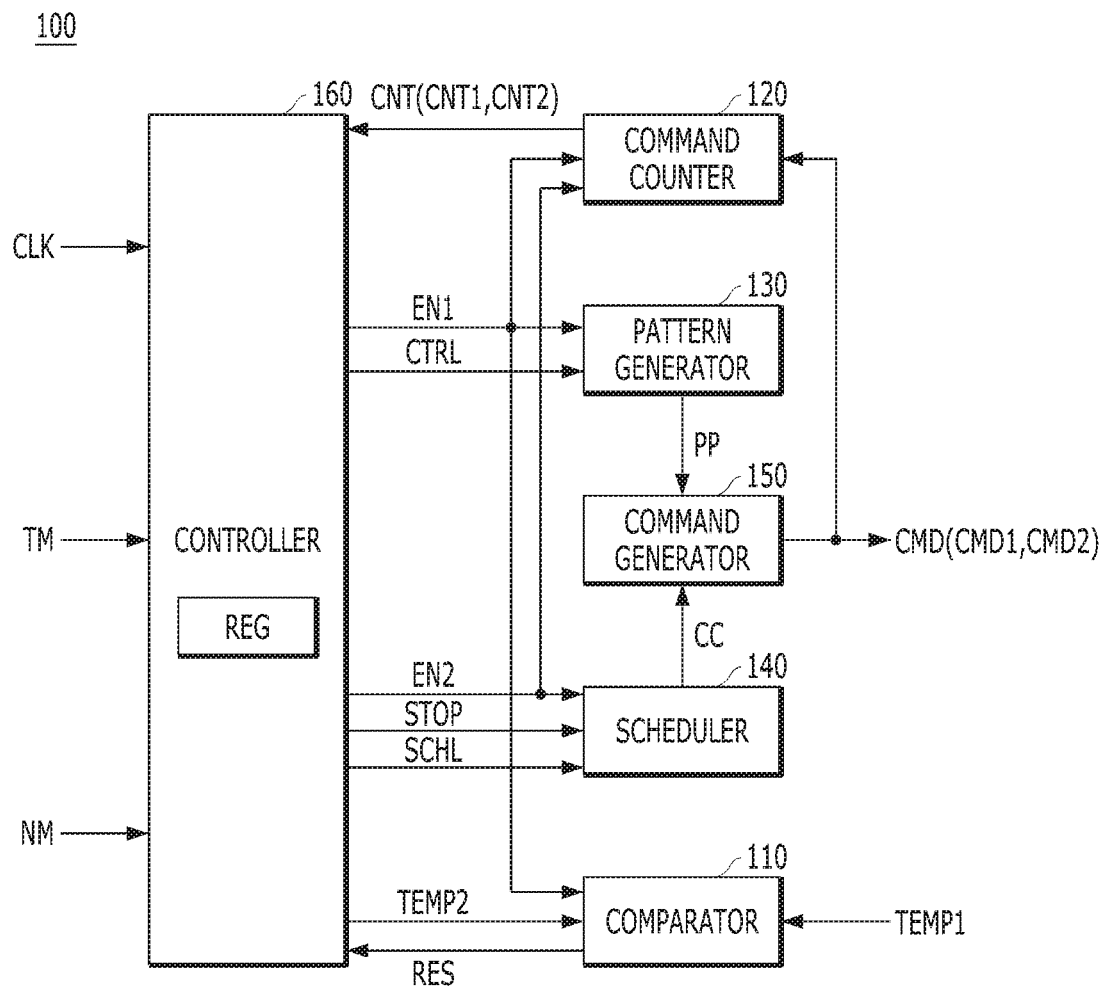
FIG. 2 is a block diagram illustrating a control device shown in FIG. 1.

FIG. 2 is a block diagram illustrating the control device 100 shown in FIG. 1.

Referring to FIG. 2, the control device 100 may include a comparator 110, a command counter 120, a pattern generator 130, a scheduler 140, a command generator 150 and a controller 160.

The comparator 110 may be enabled in the training mode, and disabled in the normal mode. The comparator 110 may compare the temperature information TEMP1 with threshold temperature information TEMP2 based on a first enable signal EN1. Further, the comparator 110 may generate a comparison result signal RES corresponding to the comparison result.

The command counter 120 may be enabled in the training and normal modes. The command counter 120 may count the first command signals CMD1 for the unit time in the training mode, based on the first enable signal EN1, and generate the first count information CNT1 corresponding to the count result. The command counter 120 may count the second command signals CMD2 for the unit time in the normal mode, based on a second enable signal EN2, and generate the second count information CNT2 corresponding to the count result.

The pattern generator 130 may be enabled in the training mode, and disabled in the normal mode. The pattern generator 130 may generate pattern information PP based on the first enable signal EN1 and a control signal CTRL. Particularly, the pattern generator 130 may change the pattern information PP according to the control signal CTRL. For example, the pattern generator 130 may change the pattern information PP to generate a larger number of command signals for the unit time.

The scheduler 140 may be enabled in the normal mode, and disabled in the training mode. The scheduler 140 may generate schedule information CC in the normal mode, based on the second enable signal EN2, a schedule control signal SCHL, and a stop signal STOP. Particularly, the scheduler 140 may generate the schedule information CC based on the schedule control signal SCHL, and stop the generation of the schedule information CC based on the stop signal STOP.

The command generator 150 may generate the first command signals CMD1 based on the pattern information PP in the training mode. Further, the command generator 150 may generate the second command signals CMD2 based on the schedule information CC in the normal mode.

The controller 160 may generate the first enable signal EN1, the control signal CTRL and the threshold temperature information TEMP2 in the training mode. Further, the controller 160 may generate the second enable signal EN2, the schedule control signal SCHL and the stop signal STOP in the normal mode. In some embodiments, the controller 160 may generate various signals and information, based on a clock signal CLK, a training mode signal TM, a normal mode signal NM, the comparison result signal RES and the first and second count information CNT1 and CNT2. Particularly, the controller 160 may generate the control signal CTRL based on the comparison result signal RES in the training mode, and generate the stop signal STOP based on the first and second count information CNT1 and CNT2 in the normal mode.

The controller 160 may include a register REG for storing the first count information CNT1 based on the comparison result signal RES in the training mode.

Hereinafter, operations of the memory system having the above-described configuration in accordance with the present embodiment will be described with reference to FIGS. 3 to 4.

Figure 3:
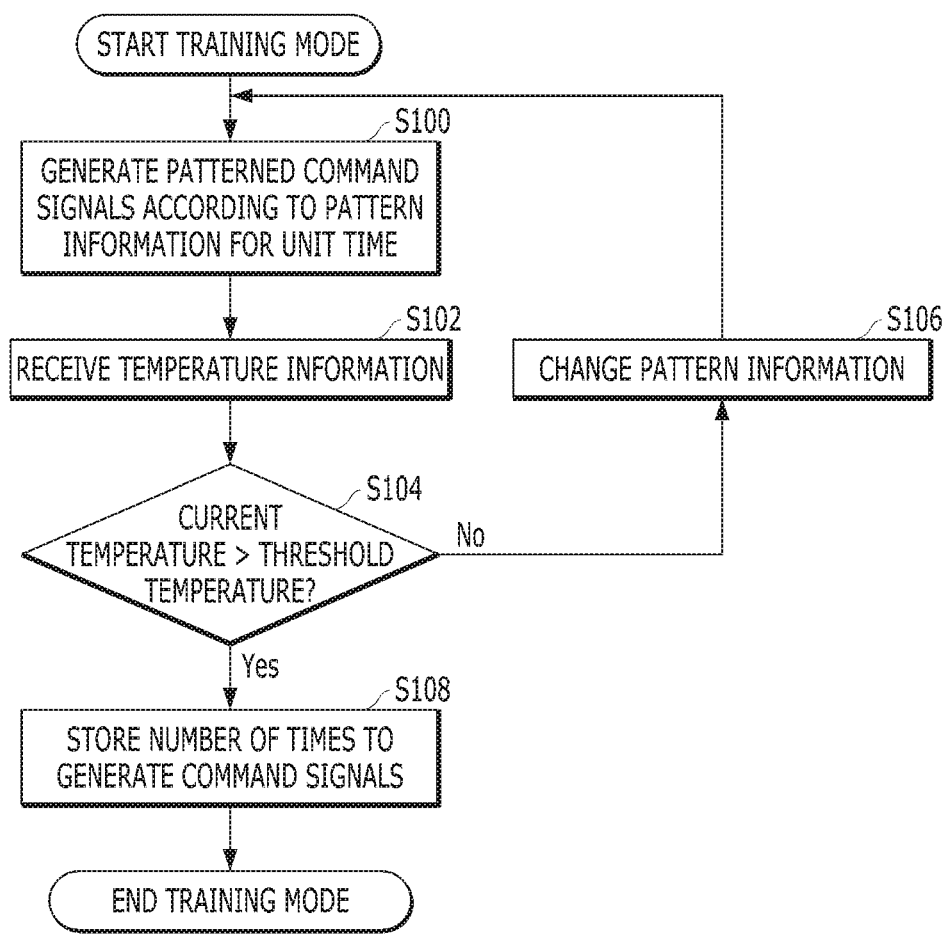
FIGS. 3 and 4 are flowcharts illustrating operations of the memory system shown in FIG. 1.

FIG. 3 is a flowchart illustrating an operation of the memory system in the training mode.

Referring to FIG. 3, the control device 100 may directly sense a current temperature of the memory device 200 when the memory device 200 performs the internal operation based on the first command signals CMD1 for the unit time in the training mode, in steps S100 to S106. In addition, the control device 100 may store the number of times to generate the first command signals CMD1 according to the current temperature as the first count information CNT1 in the training mode, in step S108. Detailed descriptions thereof are as follows.

The control device 100 may generate the first command signals CMD1 according to the default pattern information PP for the unit time, in step S100. At this time, the control device 100 may count the number of times to generate the first command signals CMD1 for the unit time, and generate the first count information CNT1.

The memory device 200 may perform the internal operation for the unit time, based on the first command signals CMD1. The memory device 200 may provide the controller 160 of the control device 100 with the temperature information TEMP1 when performing the internal operation, in step S102. The control device 100 may receive the temperature information TEMP1.

The control device 100 may monitor heat generation of the memory device 200 based on the temperature information TEMP1 and the threshold temperature information TEMP2. In other words, the control device 100 may compare the current temperature of the memory device 200 with a predetermined threshold temperature in step S104.

When the comparison result indicates that the current temperature is lower than the threshold temperature (S104, No), the control device 100 may change the pattern information PP in step S106. When the pattern information PP is changed, the number of times to generate the first command signals CMD1 may be changed. When the comparison result indicates that the current temperature is lower than the threshold temperature, the control device 100 and the memory device 200 may repeat the steps S100 to S106. When the steps S100 to S106 are repeated, it may consider the time at which the current temperature of the memory device 200 is restored to an initial temperature.

When the comparison result indicates that the current temperature is higher than the threshold temperature (S104, Yes), the control device 100 may store the first count information CNT1, which is generated by counting the number of times to generate the first command signals CMD1 corresponding to the current temperature, in the register REG.

Figure 4:
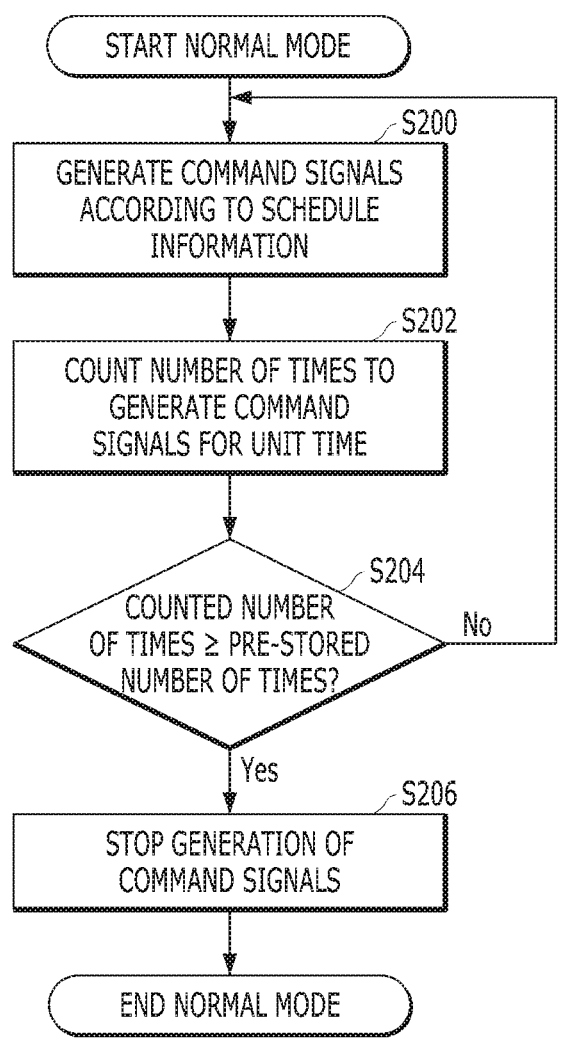

FIG. 4 is a flowchart illustrating an operation of the memory system in the normal mode.

Referring to FIG. 4, the control device 100 may indirectly monitor heat generation of the memory device 200 based on the number of times to generate the first command signals CMD1 according to the current temperature, when the memory device 200 performs the internal operation based on the second command signals CMD2 for the unit time in the normal mode, in steps S200 to S204. In other words, the control device 100 may indirectly monitor the heat generation of the memory device 200 by comparing the first count information CNT1 corresponding to the first command signals CMD1 with the second count information CNT2 corresponding to the second command signals CMD2, in the normal mode. When the monitoring result indicates that the memory device 200 generates heat, the control device 100 may stop the generation of the second command signals CMD2 in step S206. Detailed descriptions thereof are as follows.

The control device 100 may generate the second command signals CMD2 according to the schedule information CC in step S200.

The memory device 200 may perform the internal operation based on the second command signals CMD2. At this time, the control device 100 may count the number of times to generate the second command signals CMD2 for the unit time, and generate the second count information CNT2.

The control device 100 may indirectly monitor the heat generation of the memory device 200 based on the first and second count information CNT1 and CNT2. In other words, the control device 100 may compare the number of times to generate the second command signals CMD2 corresponding to the second count information CNT2 (i.e., counted number of times) with the number of times to generate the first command signals CMD1 corresponding to the first count information CNT1 (i.e., pre-stored number of times).

When the second count information CNT2 is smaller than the first count information CNT1 (S204, No), the memory device 200 may continue to perform the internal operation based on the second command signals CMD2.

When the second count information CNT2 is greater than or equal to the first count information CNT1 (S204, Yes), the control device 100 may stop the generation of the second command signals CMD2 in step S206. In other words, the control device 100 may predict that the current temperature of the memory device 200 will be higher than a threshold temperature, and take measures to prevent the temperature of the memory device 200 from further rising. At this time, the memory device 200 may enter the relax mode. For example, the memory device 200 may enter the self-refresh mode.

As is apparent from the above descriptions, the memory system in accordance with the embodiment may indirectly monitor (i.e., predict) the heat generation of the memory device in the normal mode, based on information obtained in the training mode.

According to the present embodiment, as the heat generation state of the memory device is predicted and controlled regardless of the performance of the temperature sensor in the normal mode, the operational reliability of the memory device may be improved.

According to the present embodiment, more improved effects may be expected when the memory system operates at the pseudo cryogenic temperature.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. A memory system comprising:
a control device suitable for generating first command signals for a unit time and storing first count information corresponding to the number of times to generate the first command signals based on temperature information, in a training mode, and generating second command signals based on the first count information and second count information in a normal mode, the second count information corresponding to the number of times to generate the second command signals for the unit time; and
a memory device suitable for performing an internal operation based on the first command signals and providing the control device with the temperature information when performing the internal operation, in the training mode, and performing an internal operation based on the second command signals in the normal mode.

2. The memory system of claim 1, wherein the control device stops the generation of the second command signals when the first count information and the second count information coincide with each other.

3. The memory system of claim 2, wherein the memory device enters a relax mode when the generation of the second command signals is stopped.

4. The memory system of claim 3, wherein the relax mode includes a self-refresh mode.

5. The memory system of claim 1, wherein the control device updates the first count information at each predetermined time interval.

6. The memory system of claim 1, wherein the control device includes:
a comparator suitable for comparing the temperature information with threshold temperature information, and generating a comparison result signal;
a command counter suitable for counting the first command signals for the unit time and generating the first count information, based on a first enabled signal, and counting the second command signals for the unit time and generating the second count information, based on a second enable signal;
a pattern generator suitable for generating pattern information based on the first enable signal;
a scheduler suitable for generating schedule information based on the second enable signal, and stopping the generation of the schedule information based on a stop signal;
a command generator suitable for generating the first command signals based on the pattern information, and generating the second command signals based on the schedule information; and
a controller suitable for generating the first enable signal in the training mode, and generating the second enable signal and the stop signal in the normal mode, based on a clock signal, a training mode signal, a normal mode signal, the comparison result signal and the first and second count information.

7. The memory system of claim 6, wherein the controller generates a control signal based on the comparison result signal, and
wherein the pattern generator changes the pattern information based on the control signal.

8. The memory system of claim 6, wherein the controller further includes a register for storing the first count information based on the comparison result signal.

9. The memory system of claim 1, wherein the memory device is disposed in a pseudo cryogenic region.

10. The memory system of claim 9, wherein the pseudo cryogenic region includes a region with a temperature of 77K±7K.

11. An operating method of a memory system comprising:
sensing a temperature of a memory device when the memory device performs an internal operation based on first command signals for a unit time, in a training mode;
storing the number of times to generate the first command signals according to the temperature, in the training mode; and
monitoring heat generation of the memory device based on the number of times to generate the first command signals according to the temperature when the memory device performs an internal operation based on second command signals for the unit time, in a normal mode.

12. The operating method of claim 11, wherein the monitoring of the heat generation of the memory device includes monitoring the heat generation of the memory device by comparing the number of times to generate the second command signals with the number of times to generate the first command signals.

13. The operating method of claim 11, further comprising stopping the generation of the second command signals when the memory device generates heat in the monitoring of the heat generation of the memory device, in the normal mode.

14. The operating method of claim 13, wherein the memory device enters a relax mode when the generation of the second command signals is stopped.

15. The operating method of claim 14, wherein the relax mode includes a self-refresh mode.

16. A memory system comprising:
a memory device including a temperature sensor; and
a control device suitable for:
providing training commands with the memory device in a training mode;
monitoring a temperature of the memory device from the temperature sensor;
when the monitored temperature is equal to a threshold temperature, determining the number of provided training commands;
providing normal commands with the memory device in a normal mode; and
when the number of the normal commands is equal to the number of provided training commands, stopping the providing of the normal commands.

* * * * *